United States Patent
Abe et al.

(10) Patent No.: US 6,995,399 B2
(45) Date of Patent: Feb. 7, 2006

(54) SEMICONDUCTOR LIGHT EMITTING DEVICE AND OPTICAL DISC APPARATUS USING THE SAME

(75) Inventors: Hiroaki Abe, Miyagi (JP); Shinichi Agatsuma, Miyagi (JP); Nozomu Hoshi, Miyagi (JP); Youichi Suzuki, Miyagi (JP)

(73) Assignee: Sony Corporation, Tokyo (JP)

( * ) Notice: Subject to any disclaimer, the term of this patent is extended or adjusted under 35 U.S.C. 154(b) by 84 days.

(21) Appl. No.: 10/473,688

(22) PCT Filed: Feb. 20, 2003

(86) PCT No.: PCT/JP03/01833

§ 371 (c)(1),
(2), (4) Date: Sep. 24, 2003

(87) PCT Pub. No.: WO03/071642

PCT Pub. Date: Aug. 28, 2003

(65) Prior Publication Data

US 2004/0113157 A1    Jun. 17, 2004

(30) Foreign Application Priority Data

Feb. 21, 2002    (JP) .............................. 2002-044651

(51) Int. Cl.
   *H01L 27/15*    (2006.01)
(52) U.S. Cl. .............................. 257/79; 257/81; 257/88; 257/94; 257/99; 257/103
(58) Field of Classification Search ............... 372/23, 372/45, 46, 54, 66, 68
See application file for complete search history.

(56) References Cited

U.S. PATENT DOCUMENTS

| | | | | |
|---|---|---|---|---|
| 6,195,375 B1 * | 2/2001 | Hirata | ........................ | 372/46 |
| 6,515,309 B1 * | 2/2003 | Tohyama et al. | ............. | 257/88 |
| 6,813,290 B1 * | 11/2004 | Fukuhisa | ..................... | 372/43 |

FOREIGN PATENT DOCUMENTS

| | | |
|---|---|---|
| JP | 10-22562 A | 1/1998 |
| JP | 11-186651 A | 7/1999 |
| JP | 2000-244060 A | 9/2000 |
| JP | 2001-244574 A | 9/2001 |

* cited by examiner

*Primary Examiner*—Long Pham
*Assistant Examiner*—Wai-Sing Louie
(74) *Attorney, Agent, or Firm*—Robert J. Depke; Trexler, Bushnell, Giangiorgi, Blackstone & Marr, Ltd.

(57) ABSTRACT

AlGaInP system laser device (24) and AlGaAs system laser device (26) are arranged so that respective stripes (28, 30) are parallel to each other. The AlGaInP system laser device (24) is placed to (011) plane (22b) side from the centerline of the substrate and the AlGaAs system laser device (26) is placed to the $(0\bar{1}\bar{1})$ plane (22a) side from the centerline of the substrate when viewed from the main emitting plane $(0\bar{1}\bar{1})$ (22c) side of laser light. Substrate (22) is an off substrate and inclines from the $(0\bar{1}\bar{1})$ plane (22a) toward the (011) plane (22b) with respect to the (100) plane at a certain angle (θ off) within the range of 2 degrees and 15 degrees. Optical axis $L_1$ of the AlGaInP system laser device (24) is parallel to optical axis $L_2$ of the AlGaAs system laser device (26) and approaches at an angle of about 0.5 degrees.

4 Claims, 8 Drawing Sheets

SEMICONDUCTOR LIGHT EMITTING DEVICE AND OPTICAL DISC APPARATUS USING THE SAME

This application claims priority to Japanese Patent Application Number JP2002-44651, filed Feb. 21, 2002, which is incorporated herein by reference.

TECHNICAL FIELD

The present invention relates to a so-called monolithic semiconductor light emitting device in which a plurality of light emitting elements having different emission wavelengths are mounted on one chip and to an optical disc apparatus using the semiconductor light emitting device, and specifically to a semiconductor light emitting device and an optical disc apparatus having AlGaInP system and AlGaAs system devices as a light emitting element on a common substrate.

BACKGROUND ART

In the semiconductor light emitting device area, recently, a laser diode (LD) (hereinafter it calls a multi-wavelength laser) having a plurality of light emitting elements with different emission wavelengths on a common substrate has been actively developed.

The multi-wavelength laser is used for a light source of an optical disc apparatus, for instance. Generally, the semiconductor laser light with a wavelength of 780 nm band is used for reproducing CDs (Compact Disk) and for recording/reproducing writable optical discs such as CD-R (CD Recordable), CD-RW (CD Rewritable) and MD (Mini Disk) in the optical disc apparatus. In addition, the semiconductor laser light with a wavelength of 650 nm band is used for recording/reproducing DVDs (Digital Versatile Disks). Accordingly, mounting the above-described multi-wavelength laser on the optical disc apparatus enables to record/reproduce any existing plural kinds of optical discs.

As an example of such a multi-wavelength laser, a so-called monolithic two-wavelength laser diode in which two laser diodes with different emission wavelengths are mounted on one chip has been proposed. By using the monolithic two-wavelength laser diode for a common light source for reproducing/recording process in the DVD and the CD, it is possible to miniaturize an optical pickup and to simplify the adjustment of optical system.

A laser diode comprising an AlGaInP system red semiconductor laser device (hereinafter it refers to AlGaInP laser device) as a light source for the DVD and an AlGaAs system red semiconductor laser device (hereinafter it refers to AlGaAs laser device) as a light source for the CD is cited as the above-described two-wavelength laser diode.

Figure 7A:
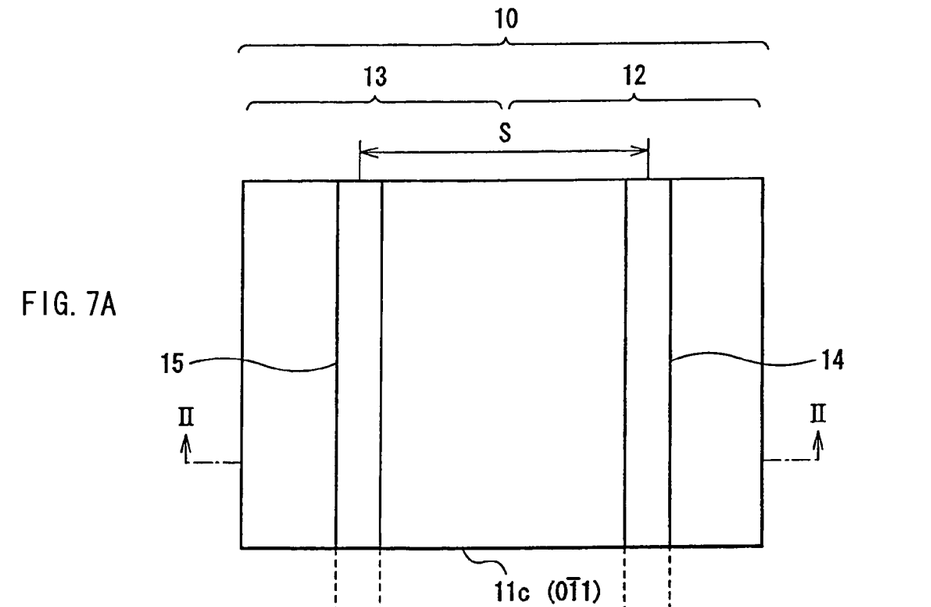
FIG. 7A is a plan view illustrating a configuration of a conventional two-wavelength laser and FIG. 7B is a front elevational view thereof.
Figure 7B:
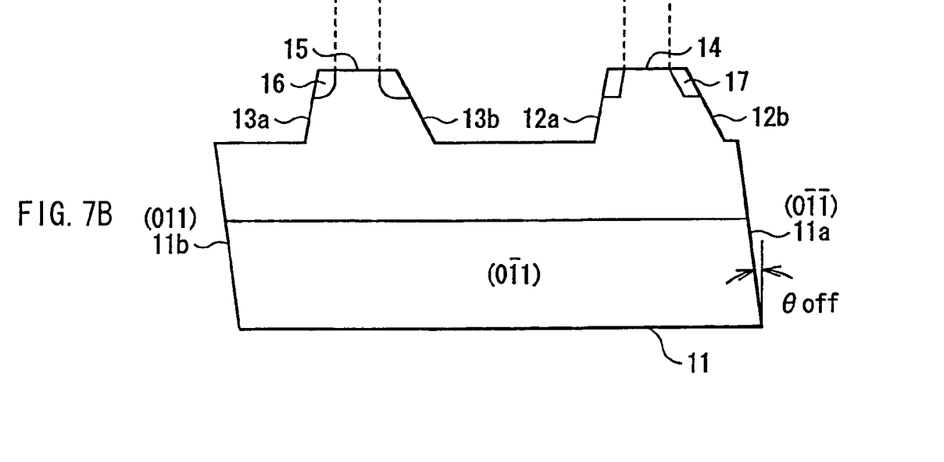

FIGS. 7A and 7B show an example of a configuration of the two-wavelength laser diode. FIG. 7A shows a planar structure thereof and FIG. 7B shows a cross sectional structure thereof taken along the line II—II in FIG. 7A. FIGS. 7A and 7B are viewed from the main emitting plane side of the laser light. A two-wavelength laser diode 10 comprises a common substrate 11 made of GaAs, and an AlGaInP laser device 12 and an AlGaAs laser device 13 which are formed on the substrate 11. The substrate 11 is a so-called off substrate in which both sides thereof incline at a certain angle (off angle) with respect to the crystal axis direction. Here, both sides of the substrate 11 incline in a counterclockwise direction, that is, from a ($0\bar{1}\bar{1}$) plane 11a toward a (011) plane 11b with respect to the crystal plane (100) when viewed from a main emitting plane ($0\bar{1}1$) 11c.

The off substrate suppresses the formation of natural superlattice to the laser devices 12 and 13 grown from the substrate and shortens the oscillation wavelength of the laser devices 12 and 13.

The AlGaInP laser device 12 is a red light emitting element having a oscillation wavelength of 650 nm and comprises an AlGaInP lower cladding layer, an active layer, an AlGaInP upper cladding layer, a GaInP layer, a GaAs contact layer and the like on the substrate 11 sequentially. The upper part of the AlGaInP laser device 12 is an air edge laser stripe 14 formed with current blocking regions 17 made of insulating layer on both sides thereof. On the other hand, the AlGaAs laser device 13 is a red light emitting element having a oscillation wavelength of 780 nm and comprises an AlGaAs lower cladding layer, an active layer, an AlGaAs upper cladding layer, a GaAs contact layer and the like on the substrate 11 sequentially. The upper part of the AlGaAs laser device 13 is a buried laser stripe 15 formed with an ion implantation layer made of B+ion on both sides thereof.

The AlGaInP laser device 12 and the AlGaAs laser device 13 are placed so that the laser stripes 14 and 15 are parallel to each other. The AlGaInP laser device 12 is placed on the ($0\bar{1}\bar{1}$) plane 11a side from the centerline of the substrate and the AlGaAs laser device 13 is placed on the (011) plane 11b side from the centerline of the substrate, when viewed from the main emitting plane ($0\bar{1}1$) 11c of the laser light. The distance S of the centerlines of the laser stripes 14 and 15 is 120 μm.

Figure 8:
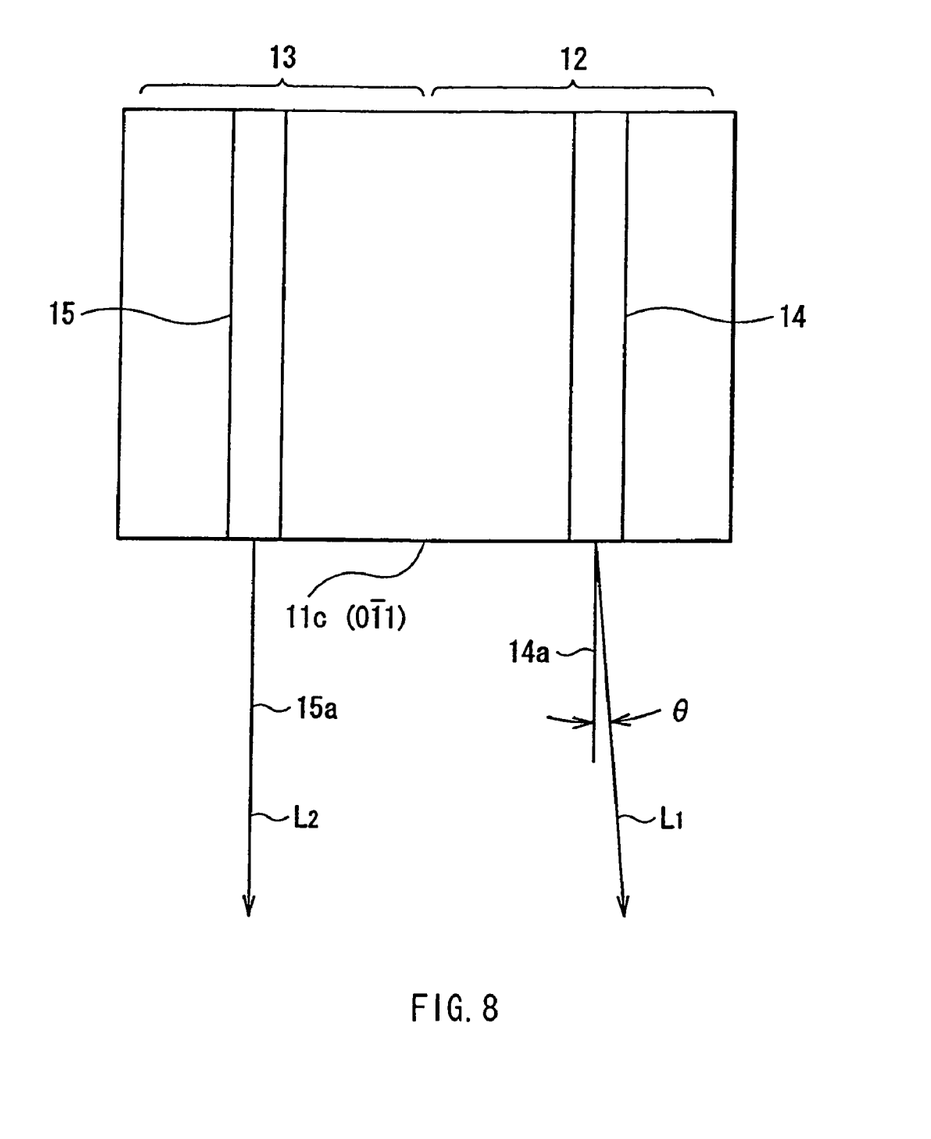
FIG. 8 is a view for explaining a state that two optical axes are separated in the conventional two-wavelength laser diode.

As can be seen from FIG. 8, in the above-mentioned two-wavelength laser diode, an optical axis $L_1$ of the AlGaInP laser device 12 and an optical axis $L_2$ of the AlGaAs laser device 13 are deviated by the distance S viewed from the main emitting plane side.

Accordingly, when using the two-wavelength laser diode for a common light source for a reproducing/recording apparatus of DVD and CD, the switching a common optical system between the AlGaInP laser device and the AlGaAs laser device, that is, alignment of each optical axis with respect to the common optical system is required to read and rewrite in the DVD and the CD.

In order to align the optical axes of the AlGaInP laser device and the AlGaAs laser device with respect to the common optical system, the lens of the common optical system needs to be relatively shifted. The shift amount is preferably minimized in terms of the miniaturization of the entire apparatus. Therefore, in the conventional two-wavelength laser diode, the laser stripes 14 and 15 are placed to make the main emitting position of the laser light of the AlGaInP laser device 12 and the AlGaAs laser device 13 approach each other.

However, although two devices are placed so that the laser stripes 14 and 15 approach in the conventional two-wavelength laser diode, a certain isolation area is required and therefore, it has been difficult to further reduce the distance S between two devices.

Although the reasons will be described hereinafter, even two devices approach as close as possible, the optical axis $L_1$ of the AlGaInP laser device 12 is deviated outside a central axis 14a of the laser stripe 14, so the distance between the optical axis $L_1$ and the optical axis $L_2$ becomes large, as shown in FIG. 8. This causes a problem that the shift amount of lens of the common optical system is larger than the distance S between the devices.

The present invention has been achieved in view of the above problems. It is a first object of the invention to provide a semiconductor light emitting device capable of reduction of the distance between the optical axes of two light emitting elements to minimize the shift amount of lens of the common optical system when used for the optical disc apparatus, and of miniaturization of the optical disc apparatus.

It is a second object of the invention to provide an optical disc apparatus capable of minimizing the shift amount of lens of the common optical system by using the semiconductor light emitting device of the present invention, thereby miniaturizing the optical disc apparatus.

DISCLOSURE OF THE INVENTION

The semiconductor light emitting device of the invention includes at least a pair of light emitting elements having a main emitting plane in the same direction on a main surface of a common substrate in adjacent position and comprises: a substrate in which side surfaces thereof incline at a certain angle (off angle) in a clockwise direction with respect to a crystal axis direction, viewed from a main emitting plane side; a first light emitting element having a trapezoidal cross section in which the left side of the opposite side surfaces is gentler than the right side thereof when viewed from a main emitting plane side; and a second light emitting element which is a counterpart of the first light emitting element is formed on the left side of the first light emitting element when viewed from a main emitting plane side.

With such a configuration, when the first light emitting element and the second light emitting element are strip shape and are parallel to each other, an optical axis of the second light emitting element corresponds to a central axis of the strip-shape thereof, whereas an optical axis of the first light emitting element corresponds to a central axis of the strip shape thereof or approaches to an optical axis side of the second light emitting element, depends on the selection of the materials of the elements.

Specifically, the following configuration is desirable.

Namely, main emitting planes of the first light emitting element and the second light emitting element are (01$\bar{1}$) plane and when viewed from the main emitting plane side, both sides of the substrate incline from the (0$\bar{1}\bar{1}$) plane toward the (011) plane direction with respect to a crystal axis (100) direction and the first light emitting element and the second light emitting element are arranged on the (011) plane side and the (0$\bar{1}\bar{1}$) plane side, respectively. The substrate is GaAs substrate and its off angle is between 2 degrees and 15 degrees. The first light emitting element is AlGaInP laser device and the second light emitting element is AlGaAs laser device, preferably.

An optical disc apparatus of the invention at least records or reproduces information on/from plural kinds of optical discs using a semiconductor light emitting device as a light source and when reading/writing information from/on the optical disc, switching the DVD to the CD, or the CD to the DVD is performed with a fewer shift amount of lens compared heretofore because the optical axes of the first and the second light emitting elements become parallel or approach.

BEST MODE FOR CARRYING OUT THE INVENTION

Preferred embodiments of the present invention will be described in more detail below referring to the accompanying drawings.

Figure 1A:
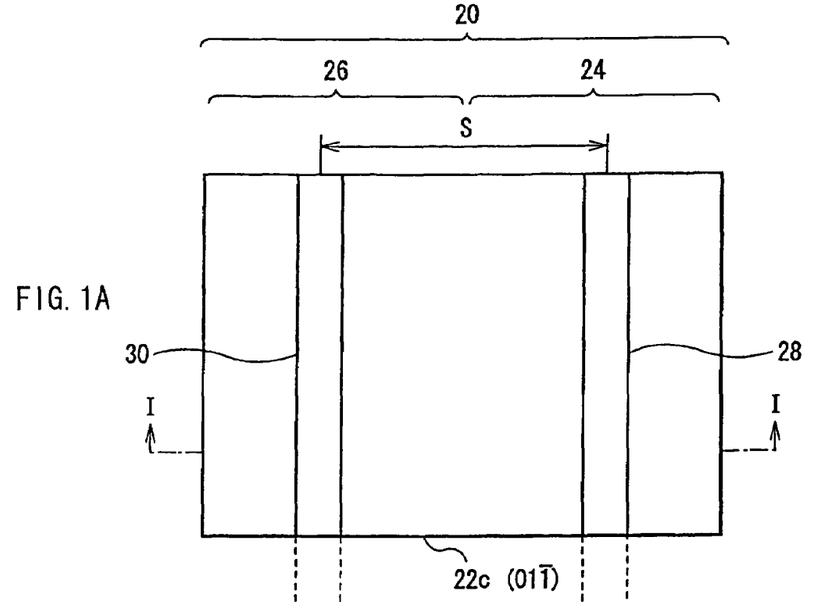
FIG. 1A is a plan view illustrating a configuration of a two-wavelength laser diode according to an embodiment of the invention and FIG. 1B is a front elevational view thereof.
Figure 1B:
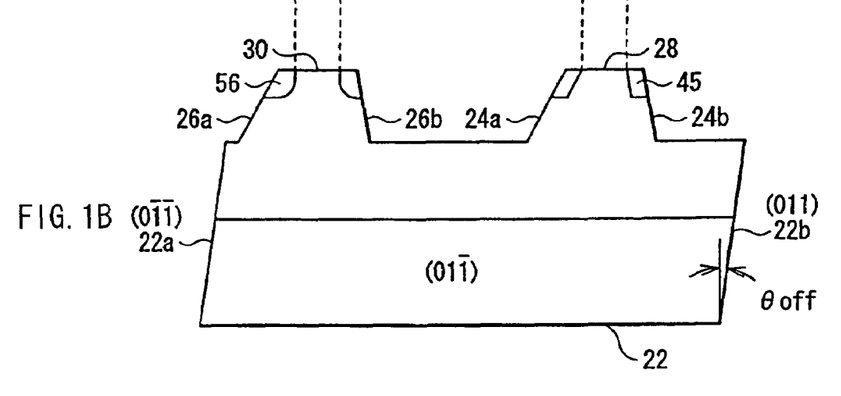

FIGS. 1A and 1B show a configuration of a two-wavelength laser diode 20 of an embodiment of the invention. FIG. 1A is a plan view and FIG. 1B is a cross section taken along the line I—I in FIG. 1A. FIGS. 1A and 1B are viewed from a main emitting plane side.

The two-wavelength laser diode 20 comprises a common substrate 22 made of GaAs, and an AlGaInP laser device 24 and an AlGaAs laser device 26 which are formed on a main surface of the substrate 22. The substrate 22 is a off substrate in which both sides thereof incline at a certain angle (off angle θ off) with respect to the crystal axis direction. Here both sides of the substrate 22 incline in a clockwise direction, that is, from a (0$\bar{1}\bar{1}$) plane 22a toward a (011) plane 22b with respect to the (100) plane at an angle (θ off) between 2 degrees and 15 degrees, both inclusive, when viewed from the front side of the paper. The front side of the paper, that is, a (01$\bar{1}$) plane 22c is the main emitting plane of the laser light of two laser devices 24 and 26.

The AlGaInP laser device 24 which is formed on the substrate 22 by later-described growing method becomes asymmetric ridge (trapezoid) in its cross section. Viewed from the main emitting plane side, the left side plane 24a of the opposite surfaces of the AlGaInP laser device 24 is gentler than the right side plane 24b. Similarly, the left side plane 26a of the opposite surfaces of the AlGaAs laser device 26 is gentler than the right side plane 26b, viewed from the main emitting plane side.

The AlGaInP laser device 24 is, for example, a red light emitting element having a oscillation wavelength of 650 nm and comprises a GaInP buffer layer, the AlGaInP lower cladding layer, the active layer, the AlGaInP upper cladding layer, the GaInP layer, the GaAs contact layer and the like sequentially formed on the substrate 22. The upper part of the AlGaInP laser device 24 is an air edge laser stripe 28 formed with current blocking regions 45 on both sides thereof.

On the other hand, the AlGaAs laser device 26 is, for example, a red light emitting element having a oscillation wavelength of 780 nm and comprises a GaAs buffer layer, the AlGaAs lower cladding layer, the active layer, the AlGaAs upper cladding layer, the GaAs contact layer and the like on the substrate 22 sequentially. The upper part of the AlGaAs laser device 26 is a buried laser stripe 30 formed with current blocking regions 56 made of an ion implantation layer of B+ion on both sides thereof.

The AlGaInP laser device 24 and the AlGaAs laser device 26 are placed so that each laser stripes 28 and 30 are parallel to each other. The AlGaInP laser device 24 is placed on the (011) plane 22b side from the centerline of the substrate and the AlGaAs laser device 26 is placed on the (0$\bar{1}\bar{1}$) plane 22a side from the centerline of the substrate, when viewed from the main emitting plane (01$\bar{1}$) 22c of the laser light. The distance S of the centerlines of the stripes 28 and 30 is 120 μm.

As described in FIG. 7B, in the conventional two-wavelength laser diode 10, when viewed from the main emitting plane (0$\bar{1}$1) 11c of the laser light, the substrate 11 inclines in a counterclockwise direction and the AlGaInP laser device 12 is placed on the (0$\bar{1}\bar{1}$) plane 11a side from the centerline of the substrate and the AlGaAs laser device 13 is placed on the (011) plane 11b side from the centerline of the substrate.

In the meanwhile, in the two-wavelength laser diode 20 of the embodiment, the inclining direction of the substrate 22 is opposite from the conventional two-wavelength laser diode 10 and the AlGaInP laser device 24 is placed on the (011) plane 22b side (the right side) from the centerline of the substrate and the AlGaAs laser device 26 is placed on the (0$\bar{1}\bar{1}$) plane 22a (the left side) from the centerline of the substrate, when viewed from the main emitting plane (01$\bar{1}$) 22c. Viewed from the main emitting plane of the laser light, the AlGaAs laser device 26 side of the AlGaInP laser device 24, that is, the left side plane 24a is gentler than the right side plane 24b.

The inventors found that during the research of reducing the shift amount of lens when switching the DVD to the CD, or the CD to the DVD, the shift amount of lens became large in the conventional monolithic two-wavelength laser diode, because, as shown in FIG. 8, the optical axis $L_1$ of the AlGaInP laser device 12 separates from the optical axis $L_2$ of the AlGaAs laser device 13 toward the main emitting direction of the laser light. When the distance angle θ is large, the malfunction of the optical pickup may be generated because the angle θ exceeds the adjustment range by the shift amount of lens.

The reason why the optical axis $L_1$ of the AlGaInP laser device 12 separates is as follows. When using the off substrate to shorten the oscillation wavelength as described above, the ridge formed by wet etching becomes asymmetry. This is because the etchant having selectivity in etching rate depends on the crystal orientation is used. The asymmetric inclining angle of the side surfaces of the ridge reduces light locked-in effect, so that the light distribution becomes asymmetry on the gentler inclining angle side (the right side in FIG. 7B). As a result, the optical axes of two laser devices separate.

The inventors presumed that when using the off substrate inclining in the reverse direction with the above-described off substrate (reverse off substrate), the incline of the side surfaces of the ridge is reversed in the right and the left side from the conventional off substrate, so that the asymmetry of light locked-in effect is reversed and two optical axes approach. Therefore, the inventors conducted various experiments. The results of the experiments show that the optical axes of two laser devices can be parallelized and approached when placing two laser devices in a specific position as described above on the off substrate with a inclining angle (off angle) within the range from 2 degrees and 15 degrees.

When the off angle (θ off) is less than 2 degrees, the generation of natural superlattice cannot be suppressed, so that this results in increase in oscillation wavelength. When the off angle is more than 15 degrees, two problems are caused. First, the asymmetry of the ridge increases and the optical axes of two laser devices approach too much in case of using the reverse off substrate.

Second, the cross sectional shape of the chip tends to be parallelogram in case of cleaving to chip, and affects on the assembly process of the chip mounting or wire bonding. The effect of reduction of wavelength is the same as the case where the off angle is 10 degrees.

Figure 2:
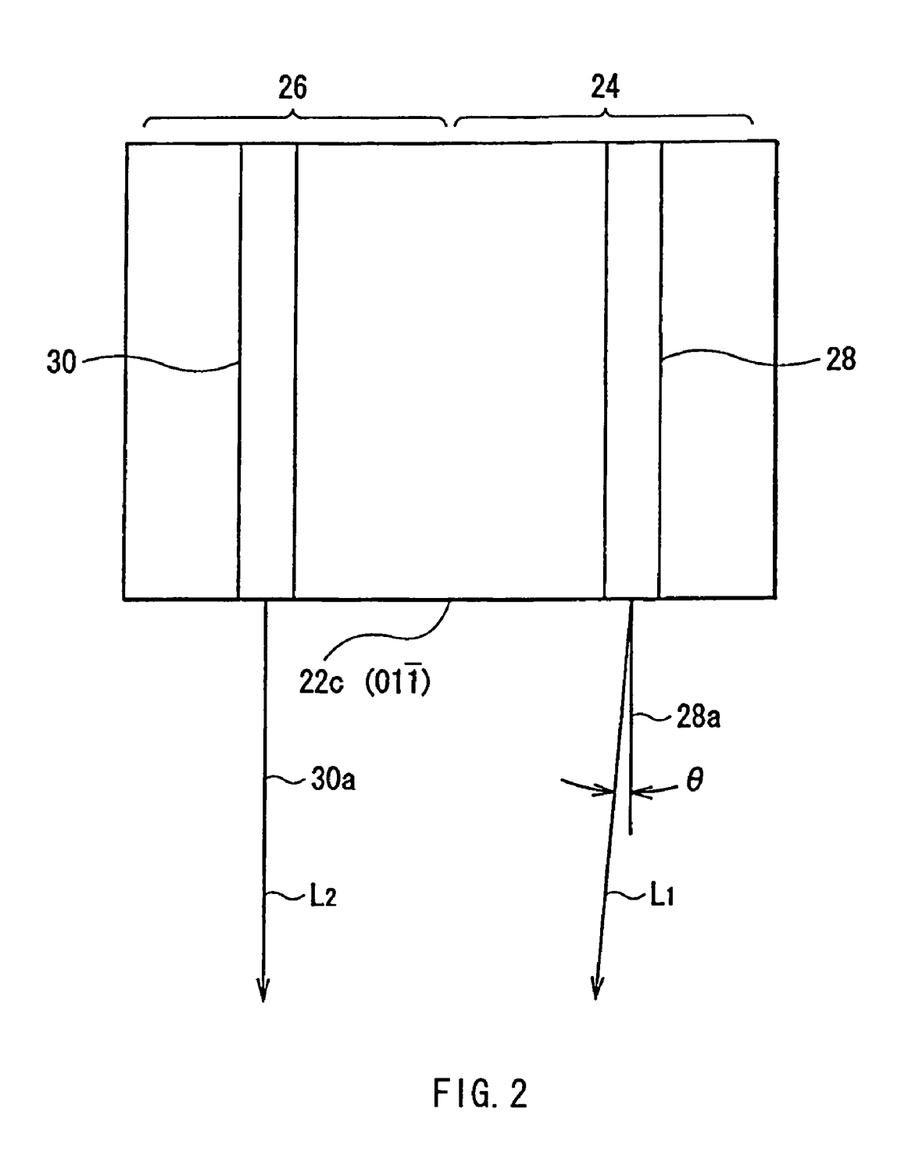
FIG. 2 is a view for explaining a close state of the optical axis of the two-wavelength laser diode.

The two-wavelength laser diode 20 of the embodiment allows the optical axis $L_1$ of the AlGaInP laser device 24 to be parallel and to approach with a angle of about 0.5 degrees (=θ) with respect to the optical axis $L_2$ of the AlGaAs laser device 26 by the above-described configuration, as shown in FIG. 2. Here, θ is an angle between the central axis 28a of the laser strip 28 of the AlGaInP laser device 24 and the optical axis $L_1$. The optical axis $L_2$ of the AlGaAs laser device 26 approximately accord with the central axis 30a of the laser stripe 30.

As described, the optical axis $L_1$ of the AlGaInP laser device 24 and the optical axis $L_2$ of the AlGaAs laser device 26 parallelize or approach each other. Therefore, as described later, the shift amount of lens during switching the DVD to the CD, or the CD to the DVD can be prominently reduced compared to the conventional monolithic two-wavelength laser diode 10 in reading or writing.

Next, a method of manufacturing the above two-wavelength laser diode 20 will be described.

Figure 3A:
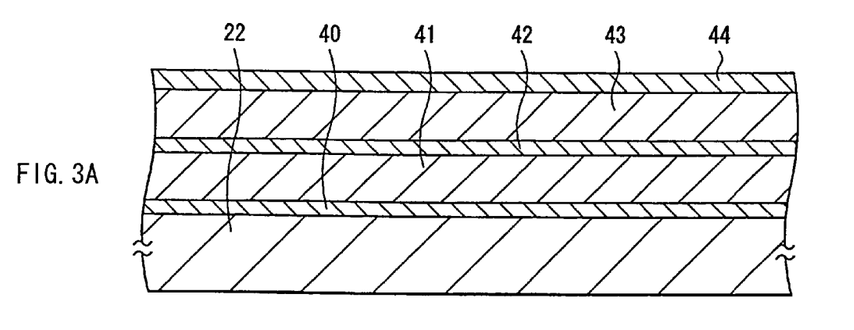
FIGS. 3A and 3B are cross sectional views for explaining a method of manufacturing the semiconductor light emitting device shown in FIG. 1A.

First, as shown in FIG. 3A, for example, the substrate 22 (off substrate) made of n-type GaAs having a thickness of about 350 μm is prepared. On the substrate 22, a buffer layer 40 made of an n-type InGaP mixed crystal, an n-type cladding layer 41 made of an n-type AlGaInP mixed crystal, an active layer 42 made of an $Al_xGa_yIn_{1-x-y}P$ (x≧0 and y≧0) mixed crystal, a p-type cladding layer 43 made of a p-type AlGaInP mixed crystal and a p-type contact layer 44 made of p-type GaAs are sequentially grown by MOCVD.

Figure 3B:
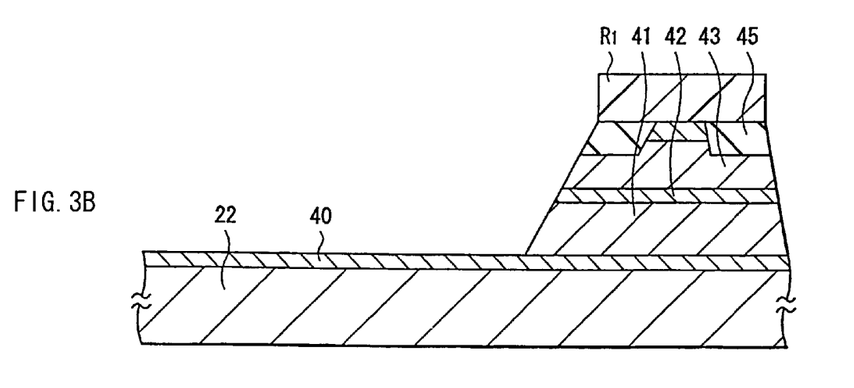

Subsequently, as shown in FIG. 3B, a mask (not shown) is formed on the p-type contact layer 44 and the upper part of the p-type contact layer 44 and the p-type cladding layer 43 are selectively etched to be a thin strip shape to expose the p-type cladding layer 43 on the surface. Then, by using the mask on the p-type contact layer 44, the insulating layer (current blocking region) 45 is formed to cover the p-type cladding layer 43 and the p-type contact layer 44.

On the p-type contact layer 44, a resist film $R_1$ is selectively formed corresponding to the region where the AlGaInP laser device 24 will be formed. After that, the portions of the p-type contract layer 44, the p-type cladding layer 43, the active layer 42 and the n-type cladding layer 41, which are uncovered with the resist film $R_1$, are selectively removed by using the resist film $R_1$ as a mask. For example, sulfuric acid system etchant is used for removing the p-type contact layer 44 and phosphoric acid system etchant or hydrochloric acid system etchant is used for removing the p-type cladding layer 43, the active layer 42 and the n-type cladding layer 41. Then, the resist film $R_1$ is removed.

Thereby, the AlGaInP laser device 24 has a trapezoid cross section and the left side thereof is gentler than the right side in front of the paper can be obtained on the substrate 22.

Figure 4A:
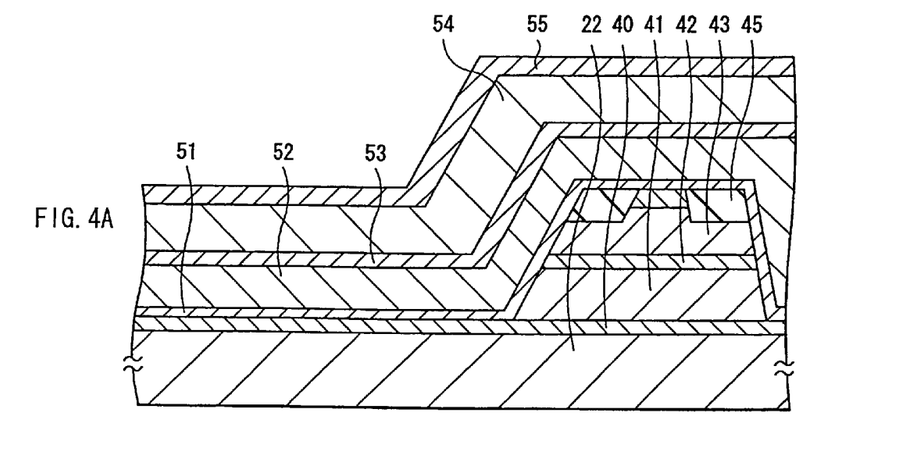
FIGS. 4A and 4B are cross sectional views for explaining a manufacturing step continued from FIG. 3B.

Subsequently, as shown in FIG. 4A, a buffer layer 51 made of n-type GaAs, an n-type cladding layer 52 made of an n-type AlGaAs mixed crystal, an active layer 53 made of an $Al_xGa_{1-x}As$ (x≧0) mixed crystal, a p-type cladding layer 54 made of a p-type AlGaAs mixed crystal and a p-type contact layer 55 made of p-type GaAs are sequentially grown on the substrate 22 by MOCVD, for example.

Figure 4B:
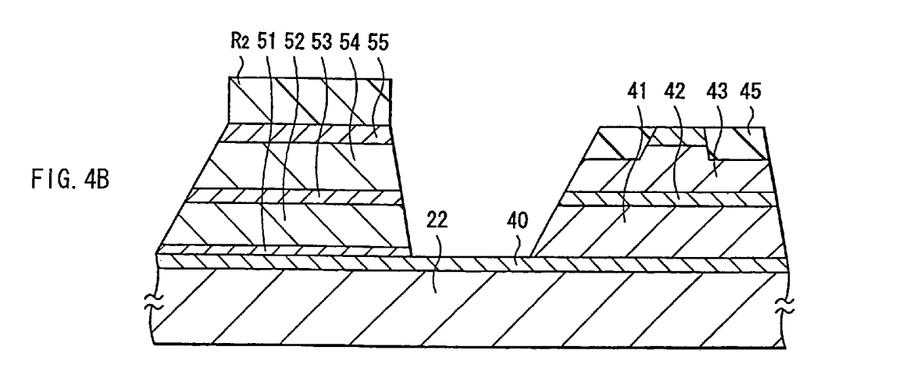

After that, as shown in FIG. 4B, a resist film $R_2$ is formed corresponding to the region where the AlGaAs laser device 26 will be formed. Then, the p-type contract layer 55, the p-type cladding layer 54, the active layer 53, the n-type cladding layer 52 and the buffer layer 51 are selectively removed by using the resist film $R_2$ as a mask. For example, sulfuric acid system etchant is used for removing the p-type contact layer 55, hydrofluoric acid system etchant is used for removing the p-type cladding layer 54, the active layer 53 and the n-type cladding layer 52, and hydrochloric acid system etchant is used for removing the buffer layer 51. Then, the resist film $R_2$ is removed.

Figure 5A:
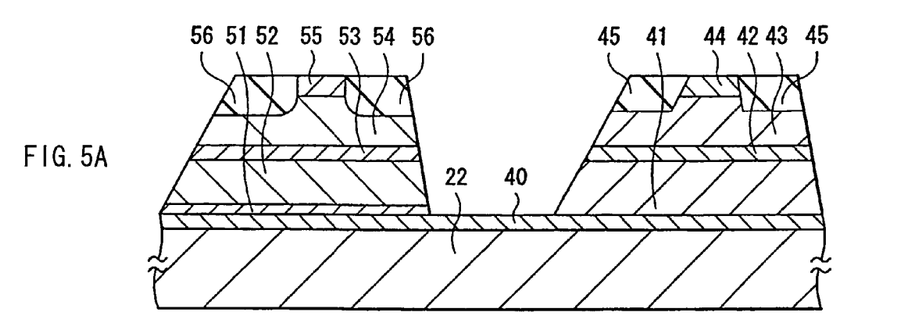
FIGS. 5A and 5B are cross sectional views for explaining a manufacturing step continued from FIG. 4B.

After removing the resist film $R_2$, as shown in FIG. 5A, by using a thin strip-shaped mask (not shown), an n-type impurity such as silicon is ion-implanted in the upper part of the p-type contact layer 55 and the p-type cladding layer 54. As a result, the region introduced impurity is insulated and becomes a current blocking region 56.

Figure 5B:
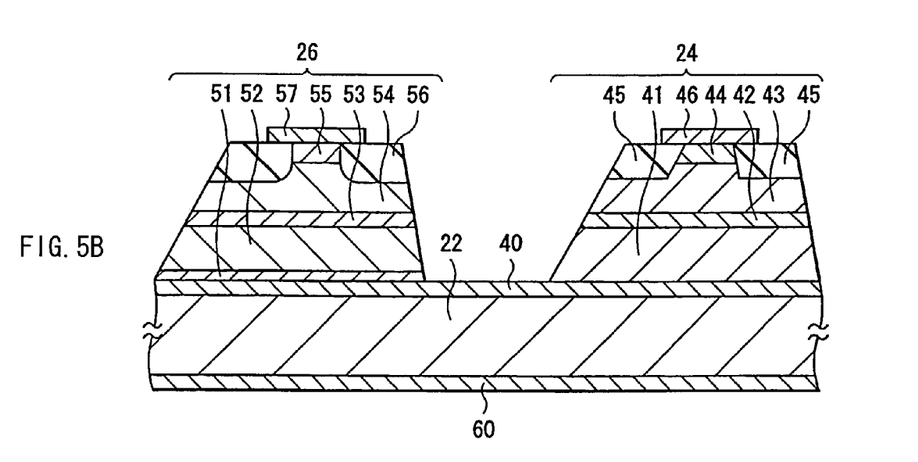

After forming the current blocking region 56, as shown in FIG. 5B, for example, nickel, platinum and gold are sequentially deposited on the surface and vicinity of the p-type contact layers 44 and 55 to form p-side electrodes 46 and 57. Further, the backside of the substrate 22 is lapped and polished to have a thickness of, for example, 100 $\mu$m.

On the backside of the substrate 22, for example, an alloy of gold and germanium, nickel and gold are sequentially deposited to form an n-side electrode 60, which is common in two laser devices 24 and 26. After that, heat treatment is applied to alloy the p-side electrodes 46 and 57 and the n-side electrode 60. Further, the substrate 22 is cleaved in a certain width in a direction perpendicular to the length direction of the p-side electrodes 46 and 57 and a pair of reflective films are formed on the cleaved surface. Thereby, the two-wavelength laser diode 20 of the embodiment is fabricated.

The two-wavelength laser diode 20 is used for an optical disc apparatus (optical pickup), for instance.

Figure 6:
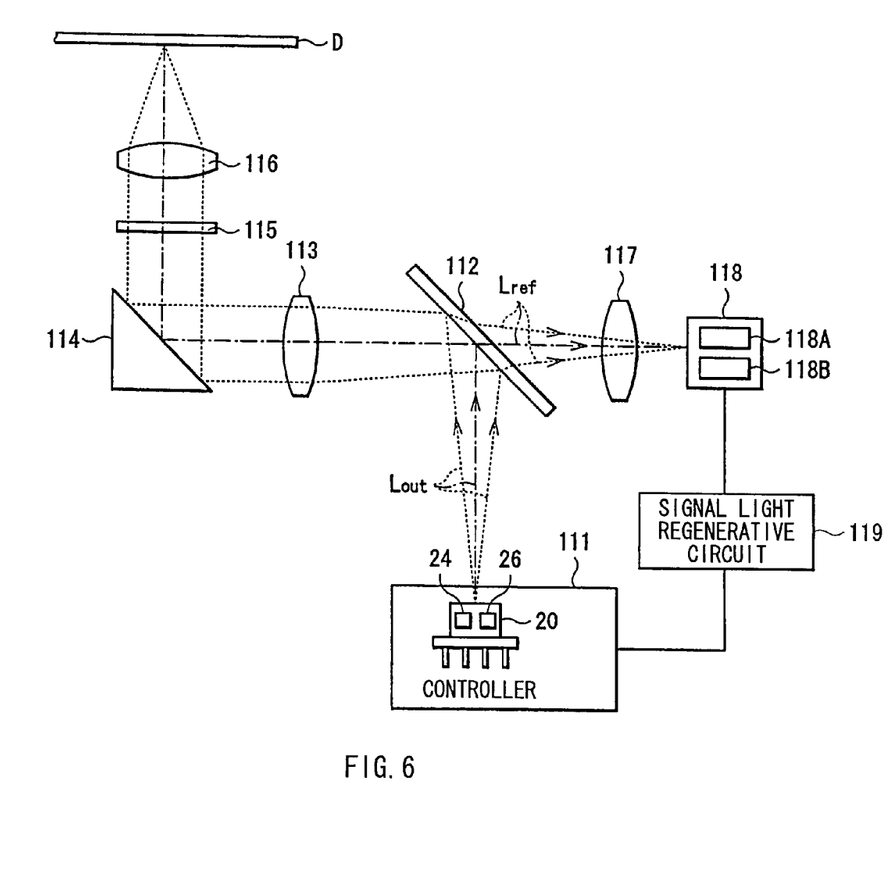
FIG. 6 is a view illustrating a configuration of an optical disc apparatus using the two-wavelength laser diode of the invention.

FIG. 6 shows a configuration of an optical disc apparatus. The optical disc apparatus utilizes light with different wavelengths to read (reproduce)/write (record) information from/on the optical disc.

The optical disc apparatus comprises an optical system which is used for leading emitted light $L_{out}$ from either the laser device 24 or the laser device 26 in the two-wavelength laser diode 20 to an optical disc D, and for reading signal light (reflective light) $L_{ref}$ from the optical disc D based on controller 111. The optical system comprises a beam splitter 112, a collimating lens 113, a mirror 114, a limiting aperture 115, an objective lens 116, a lens 117 for detecting signal light, a receiving element 118 for detecting signal light and a signal light regenerative circuit 119. The receiving element 118 for detecting signal light includes a first photo diode 118A for receiving red laser light with a wavelength of 650 nm emitted from the AlGaInP laser device 24 and a second photo diode 118B for receiving red laser light with a wavelength of 780 nm emitted from the AlGaAs laser device 26.

In the optical disc apparatus, the emitted light $L_{out}$ having a large intensity emitted from the AlGaInP laser device 24 or the AlGaAs laser device 26 of the two-wavelength laser diode 20 is reflected on the beam splitter 112, parallelized in the collimating lens 113 and reflected on the mirror 114. The emitted light $L_{out}$ reflected on the mirror 114 passes through the limiting aperture 115, is converged by the objective lens 116 and enters the optical disc D. In result, information is written on the optical disc D. When the slight emitted light $L_{out}$ is emitted from the two-wavelength laser diode 20, the emitted light $L_{out}$ enters the optical disc D though each optical system as described above and then is reflected on the optical disc D. The reflected light $L_{ref}$ passes through the objective lens 116, the limiting aperture 115, the mirror 114, the collimating lens 113, the beam splitter 112 and the lens 117 for detecting signal light and enters in the receiving element 118 for detecting signal light. The reflected light $L_{ref}$ is converted to an electronic signal and then information written on the optical disc D is reproduced in the signal light regenerative circuit 119.

When the emitted light $L_{out}$ is the red laser light with a wavelength of 650 nm from the AlGaInP laser device 24, the first photo diode 118A receives the emitted light $L_{out}$ in the receiving element 118 for detecting signal light, whereas the second photo diode 118B receives the emitted light $L_{out}$ in case of the red laser light with a wavelength of 780 nm emitted from the AlGaAs laser device 26. Except that, the paths of the laser light of laser devices 24 and 26 are the same.

As mentioned above, the optical axes of the AlGaInP laser device 24 and the AlGaAs laser device 26 approach, so that during the reading/writing, the shift amount of lens when switching the optical disc D from the DVD to the CD, or the CD to the DVD is prominently reduced compared to that of the conventional monolithic two-wavelength laser diode. In result, the adjustment of the optical system of the optical pickup is facilitated and the yield of the optical pickup is improved. In addition, the reduction of the shift amount of lens allows reducing the optical aberration depends on the lens shift, so that high SN ratio (jitter) of the signal from the optical disc D such as the DVD and the CD and the stable reading and writing by the optical pickup are secured.

The recording medium includes not only the CD and the DVD but also the existing optical discs such as CD-ROM (Read Only Memory), CD-R, CD-RW, MD and DVD-ROM, DVD-RAM (Random Access Memory), DVD+RW, DVD−R/RW and the recordable optical discs having higher surface recording density (20 gigabytes or higher, for example) such as DVR (Digital Video Recorder) and VDR (Video Disk Recorder), which have been proposed as the next generation optical disc apparatus. The two-wavelength laser diode 20 of the embodiment is applicable to these recording media for recording and reproducing. If these next generation high-capacity recordable discs can be utilized, image data can be recoded and reproduced with good quality and operationality.

Here, the two-wavelength laser diode 20 is applied to the optical disc recording/reproducing apparatus. However, the two-wavelength laser diode 20 can be applied to the general optical apparatus such as the optical disc reproducing apparatus, the optical disc recording apparatus, the magneto-optical disc apparatus for recording/reproducing MO (Magneto-optical disk) and optical communication apparatus as well as devices equipped with a in-vehicle laser diode required for operating under high temperature.

In the above embodiment, each layer made of a compound of AlGaAs or AlGaInP is formed by MOCVD. However, other vapor phase epitaxy such as MBE (Molecular Beam Epitaxy) and hydride vapor phase epitaxy may be used.

The composition of the AlGaInP laser device 24 as the first light emitting element and the AlGaAs laser device 26 as the second light emitting element are not limited to the above as long as lattice matched to the GaAs substrate.

Further, as the device, the combination of AlGaInP system and AlGaAs system is not limited. The off substrate where the sides thereof incline at an angle within a certain range (2 degrees to 15 degrees) in a clockwise direction with respect to the crystal axis direction and the light emitting element on one side (right side) has a trapezoidal cross section in which the left side of the opposite side surfaces is gentler than the right side when viewed from a main emitting direction may be applicable.

As described, in the semiconductor light emitting device of the invention, when viewed from a main emitting plane side, on the main surface of the substrate inclining its sides at a certain angle (off angle) in a clockwise direction, the first light emitting element having trapezoidal (ridge) cross section is formed so that the left side of the opposite side surfaces is gentler than the right side and the second light emitting element is formed on the left side of the first light emitting element. As a result, compared to the conventional semiconductor light emitting device, the optical axis of the first light emitting element approaches to the optical axis of the second light emitting element.

Therefore, utilizing the semiconductor light emitting device as a light source of the optical disc apparatus enables to switch the DVD to the CD, or the CD to the DVD with a slight shift amount of lens during reading/writing information from/on the optical disc, for example. As a result, the shift amount of lens is prominently reduced compared to that of the conventional monolithic two-wavelength laser diode, thereby facilitating the adjustment of the optical pickup of the optical system and improving the manufacturing yield. Furthermore, the decreased shift amount of lens allows reducing the optical aberration depends on the lens shift and ensuring the high SN ratio (jitter) of the signal from the optical disc D such as the DVD and the CD, and stable recording and writing by the optical pickup.

What is claimed is:

1. A semiconductor light emitting device including at least a pair of light emitting elements having a main emitting plane in the same direction on a main surface of a common substrate in adjacent position, comprising:
    a substrate in which side surfaces thereof incline at a certain angle (off angle) in a clockwise direction with respect to a crystal axis direction, viewed from a main emitting plane side;
    a first light emitting element having a trapezoidal cross section in which the left side of the opposite side surfaces is gentler than the right side thereof when viewed from a main emitting plane side; and
    a second light emitting element which is a counterpart of the first light emitting element is formed on the left side of the first light emitting element when viewed from a main emitting plane side; and
    wherein the first light emitting element and the second light emitting element are strip shape and parallel to each other, and a central axis of the strip-shaped second light emitting element corresponds to an optical axis direction, whereas an optical axis of the first light emitting element corresponds to a central axis of the strip shape thereof or approaches to an optical axis side of the second light emitting element; and
    wherein main emitting planes of the first light emitting element and the second light emitting element are $(01\bar{1})$ plane and when viewed from the main emitting plane side, both sides of the substrate incline from the $(0\bar{1}\bar{1})$ plane toward the (011) plane direction with respect to a crystal axis (100) direction and the first light emitting element and the second light emitting element are arranged on the (011) plane side and the $(0\bar{1}\bar{1})$ plane side, respectively.

2. A semiconductor light emitting device including at least a pair of light emitting elements having a main emitting plane in the same direction on a main surface of a common substrate in adjacent position, comprising:
    a substrate in which side surfaces thereof incline at a certain angle (off angle) in a clockwise direction with respect to a crystal axis direction, viewed from a main emitting plane side;
    a first light emitting element having a trapezoidal cross section in which the left side of the opposite side surfaces is gentler than the right side thereof when viewed from a main emitting plane side; and
    a second light emitting element which is a counterpart of the first light emitting element is formed on the left side of the first light emitting element when viewed from a main emitting plane side;
    wherein an off angle of the substrate is between 2 degrees and 15 degrees.

3. A semiconductor light emitting device according to claim 1, wherein the substrate is GaAs system substrate, the first light emitting element is AlGaInP system laser device and the second light emitting element is AlGaAs system laser device.

4. A semiconductor light emitting device according to claim 3, wherein the first light emitting element and the second light emitting element emit laser light of 650 nm band in wavelength and 750 nm band in wavelength, respectively.

* * * * *